US 6,590,815 B2

(12) United States Patent
Mine (10) Patent No.: US 6,590,815 B2
(45) Date of Patent: Jul. 8, 2003

(54) SEMICONDUCTOR MEMORY DEVICE AND METHOD FOR ITS TEST

(75) Inventor: Koji Mine, Tokyo (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/976,956

(22) Filed: Oct. 12, 2001

(65) Prior Publication Data

US 2002/0080657 A1 Jun. 27, 2002

(30) Foreign Application Priority Data

Oct. 13, 2000 (JP) .................................. 2000-314275

(51) Int. Cl.[7] ................................................ G11C 8/00
(52) U.S. Cl. ........................ 365/200; 365/201; 365/222
(58) Field of Search ............................... 365/200, 201, 365/222, 230.06

(56) References Cited

U.S. PATENT DOCUMENTS 5,381,373 A * 1/1995 Ohsawa ..................... 365/201
6,137,736 A * 10/2000 Kitayama .................. 365/200
6,160,745 A * 12/2000 Hashimoto ................ 365/200

FOREIGN PATENT DOCUMENTS

JP        10-062180        3/1998

OTHER PUBLICATIONS

English Bibliography and Abstract of JP 10–062180 (noted above).

* cited by examiner

Primary Examiner—Tan T. Nguyen
(74) Attorney, Agent, or Firm—Darryl G. Walker; Bradley T. Sako (57) ABSTRACT

A semiconductor memory device and method for its test is disclosed including a CBR (CAS before RAS) refresh test achieved by inputting a CBR command for every redundant word line to be selected. In this way, redundant word lines may be selected without repetition until all of the redundant word lines have been selected. By doing so, an accurate determination of the refresh period may be obtained. A CBR refresh counter (15) may be activated every time a control signal is received when a refresh test on redundant memory cells (RC) is performed. Redundant counter signals (RCNT0 to RCNT5) may be applied to a X address buffer (2A). X address buffer (2A) may select the redundant counter signals (RCNT0 to RCNT5) to sequentially select the redundant word lines (RWL0 to RWL63) when a redundant refresh test is performed.

20 Claims, 9 Drawing Sheets

SEMICONDUCTOR MEMORY DEVICE AND METHOD FOR ITS TEST

TECHNICAL FIELD

The present invention relates generally to a semiconductor memory device, and more specifically to a semiconductor memory device including refresh test circuit for subjecting redundancy memory cells to a refresh test and a method for its test.

BACKGROUND OF THE INVENTION

Due to a large bit capacity, a semiconductor memory device such as a dynamic random access memory (DRAM) is typically used as a main memory of a computer. A memory cell on a DRAM includes a data holding capacitor and a data transfer transistor. Each memory cell can store one bit of data by storing a quantity of electric charge as determined by the logic value of the stored data.

Over time, the stored electric charge can leak away from the memory cell and the integrity of the data can be compromised. The stored electric charge typically leaks away due to junction leakage current and subthreshold leakage current through the data transfer transistor.

In order to improve data integrity, refresh operations are performed to restore the electric charge stored in each memory cell.

A self refresh operation is one method used to restore the electric charge in each memory cell. In this case, the refresh is automatically executed for all the word lines of a memory cell array by using a counter having a predetermined count period and an internally generated address.

A CBR (CAS before RAS) refresh is another method used to restore the electric charge in each memory cell. In this case, a CBR command is input and an address counter provides the row address so that a word line is selected and memory cells are refreshed. CBR commands are continuously input until all word lines have been selected.

Each memory cell must be refreshed within a predetermined time period according to the specification of the DRAM. Thus, it is necessary that a refresh test is performed to determine if a DRAM satisfies the refresh period.

If the refresh test identifies a word line corresponding to a memory cell that fails the refresh test, a redundant word line can be used to replace the defective memory cell or row of memory cells. In this way, the overall manufacturing yield can be improved.

It is thus desirable that the same refresh test be performed for memory cells connected to the redundant word lines as is performed in the normal memory cells.

However, before fuse trimming (or blowing) is performed, an address of the redundant word line is not defined. This can make it difficult to perform a CBR refresh test for a memory cell that corresponds to the redundant word line in the same manner as an ordinary word line. This reason will now be described with reference to FIG. 1.

Figure 1:
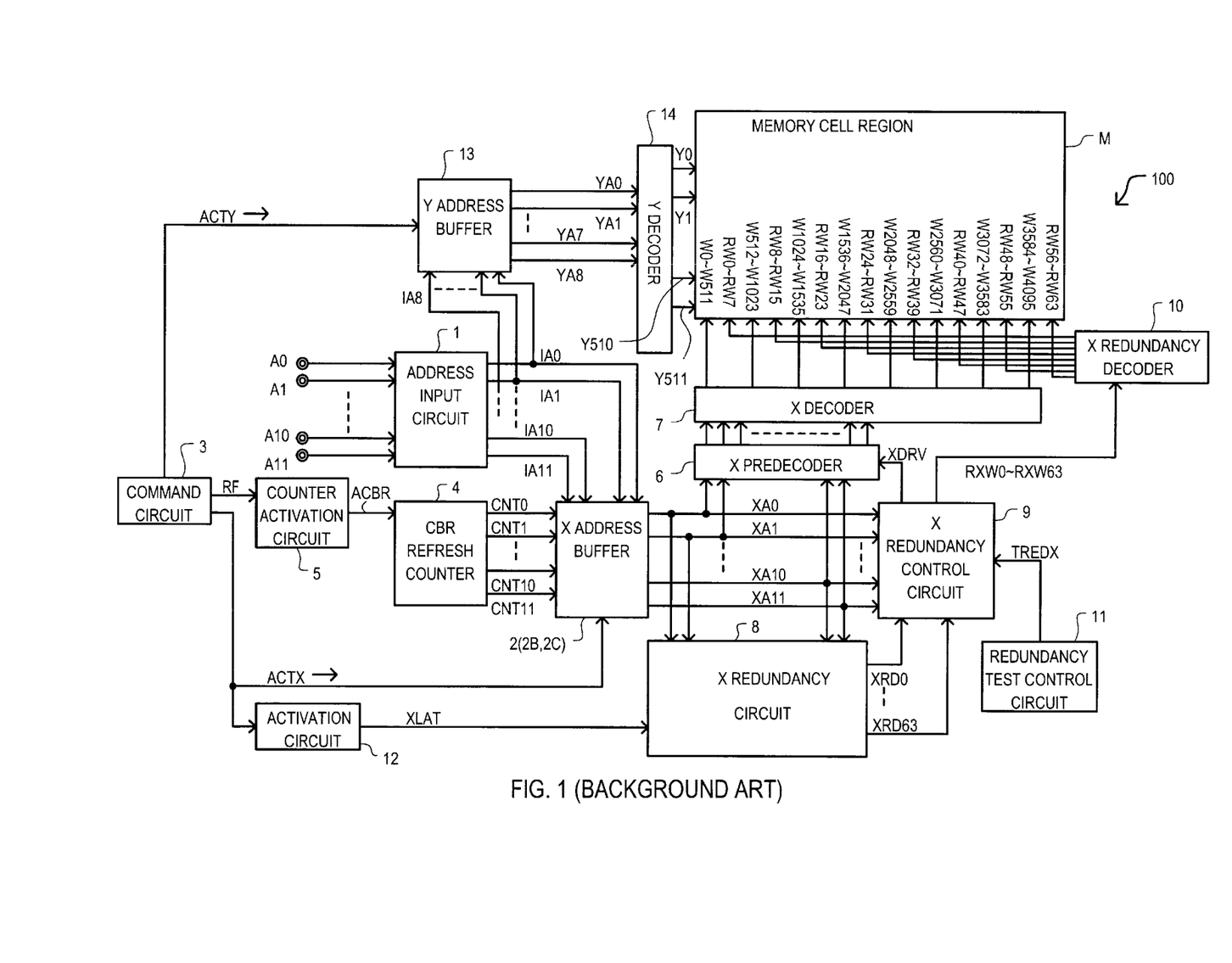
FIG. 1 is a block schematic diagram of a conventional DRAM.

Referring now to FIG. 1, a block schematic diagram of a conventional DRAM is set forth and given the general reference character 100. Conventional DRAM 100 is illustrated from the viewpoint of performing a CBR refresh test.

Conventional DRAM 100 includes a x1 bit input/output construction and a memory cell region M having a 2 Mbit capacity and redundant word lines.

A command circuit 3 receives and decodes an external command and outputs command signals such as a CBR reference command signal RF, a RAS system activation signal ACTX, and a CAS system activation signal ACTY in accordance with the received command. A counter activation circuit 5 receives the CBR refresh command signal and outputs a CBR refresh counter activation signal ACBR accordingly.

CBR refresh counter 4 is activated by CBR refresh counter activation signal ACBR to count an input CBR command and output address counter signals (CNT0 to CNT11).

Address input circuit 1 shapes and translates externally received address signal (A0 to A11) and outputs internal address signals (IA0 to IA11).

X address buffer 2 multiplexes between internal address signals (IA0 to IA11) and address counter signals (CNT0 to CNT11) based upon RAS system activation signal ACTX to provide internal X address signals (XA0 to XA11).

X predecoder 6 decodes internal x address signals (XA0 to XA11) and outputs word line select signals (XP0 to XP4095). X decoder 7 selects and provides a boosted voltage to one of word lines (W0 to W4095) based upon word select signals (XP0 to XP4095).

Activation circuit 12 receives RAS system activation signal ACTX and outputs X address latch signal XLAT. X redundancy circuit 8 latches internal X address signals (XA0 to XA11) based upon X address latch signal XLAT and outputs internal redundant word line select signals (XRD0 to XRD63) in accordance with the value of internal X address signals (XA0 to XA11) and the value of fuse structures forming a ROM (read only memory) within X redundancy circuit 8. In this way, ordinary word lines can be replaced with redundant word lines.

In the redundancy test mode, redundancy test control circuit 11 activates a redundancy test mode activation signal TREDX. When redundancy test mode activation signal TREDX is activated, X redundancy control circuit 9 decodes internal x address signals (XA0 to XA11) to select one of redundant word line select signals (RXW0 to RXW63) and output a redundancy circuit use signal XRDV to deactivate of X predecoder 6.

X redundancy decoder 10 selects one of redundant word lines (RW0 to RW63) based on the redundant word line select signals (RXW0 to RXW63) and provides a boosted level on the one selected.

Y address buffer 13 outputs internal Y address signal (YA0 to YA8) based upon internal address signals (IA0 to IA8) when an active CAS system activation signal ACTY is received. Y-decoder 14 provides Y switch signals (Y0 to Y511) that select sense amplifiers corresponding to respective bit lines.

Memory cell region M is arranged to include 512 bit lines (bit line pairs), 4096 ordinary word lines and 64 redundant word lines. The bit lines are arranged perpendicular to and intersect the ordinary word lines and redundant word lines.

Figure 2:
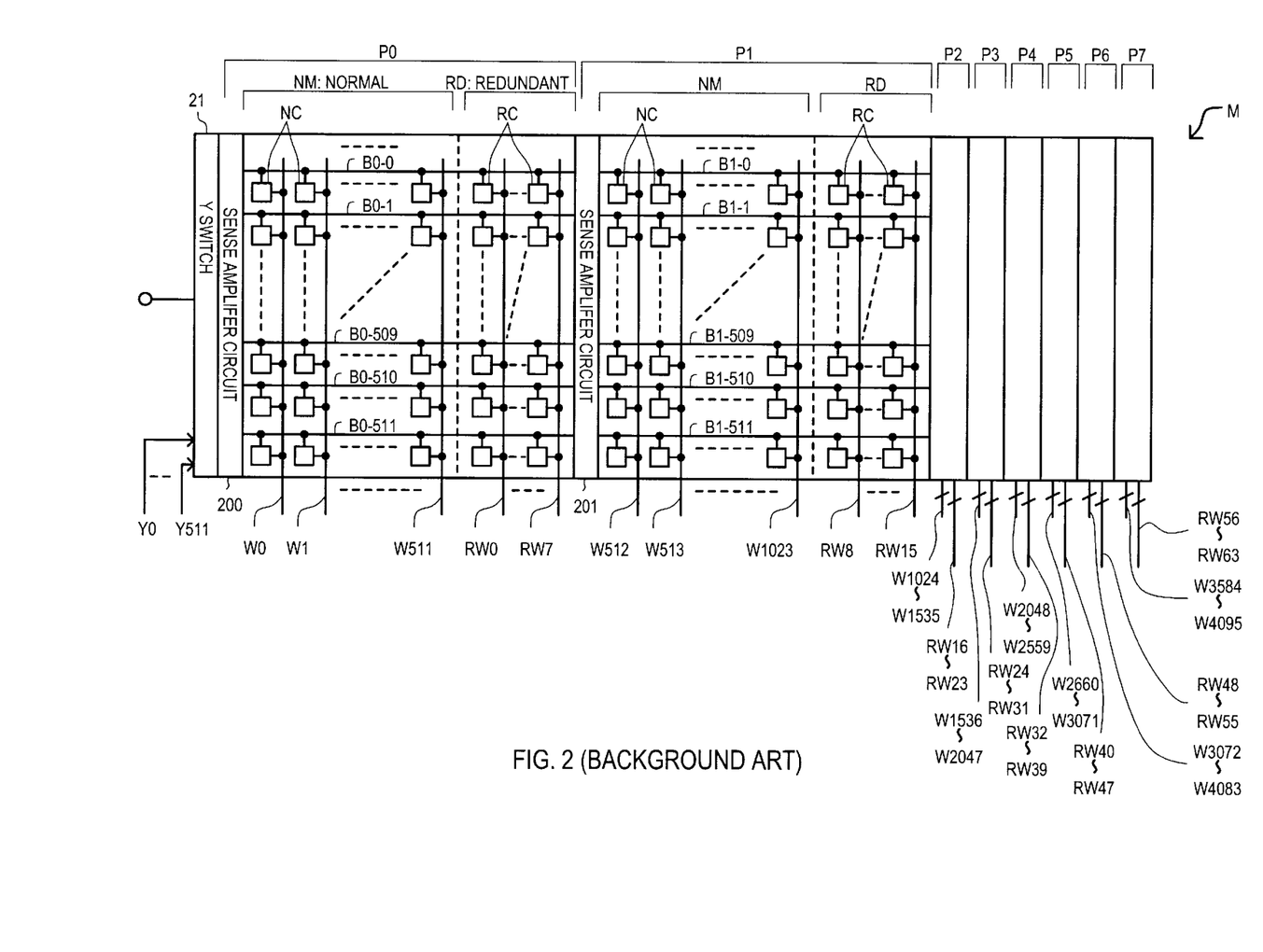
FIG. 2 is a block schematic diagram illustrating the arrangement of a memory cell region of conventional a DRAM.

Referring now to FIG. 2, a block schematic diagram illustrating the arrangement of memory cell region M of conventional DRAM 100 is set forth.

Memory cell region M is divided into eight plates (P0 to P7). Each plate (P0 to P7) includes 512 word lines. For example, plate P0 includes word lines (W0 (#000) to W511 (#1FF)), plate P1 includes word lines (W512 (#200) to W1023 (#3FF)), etc. and plate P7 includes word lines (W3584 (#D00) to W4095 (#FFF)), where # indicates a word line address in hexidecimal notation.

Each plate (P0 to P7) includes 8 redundant word lines. For example, plate P0 includes redundant word lines (RW0

(#000) to RW7 (#007)), plate P1 includes redundant word lines (RW8 (#200) to RW15 (#207)), etc., and plate P7 includes redundant word lines (RW56 (#E00) to RW63 (#E07)), where # indicates a word line address in hexidecimal notation representing addresses represented by lower addresses (XA0, XA1, and XA2) and plate select addresses (XA9, XA10, and XA11).

Redundant word lines (RW0 to RW7) are used as replacement word lines for plate P0 and redundancy word lines (RW8 to RW15) are used as replacement word lines for plate P1, etc.

In plate P0, sense amplifier circuit 200 and bit lines (B0-0 to B0-511) are provided in a normal cell array NM and a redundant cell array RD. Also, in plate P1, sense amplifier circuit 201 and bit lines (B1-0 to B1-511) are provided in a normal cell array NM and a redundant cell array RD. Likewise, in plates (P2 to P7), respectively, there are sense amplifier circuits and 512 bit lines individually provided in a memory cell array NM and redundant cell array RD. Plates (P2 to P7) are not shown in detail in order to avoid unduly cluttering the figure.

In memory cell array NM, a memory cell NC is formed at predetermined intersections between word lines and bit lines.

In the same fashion, in redundant cell array RD, a redundant memory cell RC is formed at predetermined intersections between redundant word lines and bit lines.

A sense amplifier circuit (200 to 207) is provided for each plate (P0 to P7), respectively, to amplify data placed on bit lines when a word line is selected. A sense amplifier circuit (200 to 207) amplifies a differential voltage formed by a data signal and a reference potential to provide a logic data value.

A Y switch 21 selects an individual sense amplifier from a sense amplifier circuit 200 to 207) with Y switch signals (Y0 to Y511). In this way, data is input from an input/output buffer to a bit line during a write operation and data is output to an input/output buffer during a read operation.

The CBR refresh test for ordinary memory cells NC and redundant memory cells RC of conventional DRAM 100 will now be described.

Figure 3:
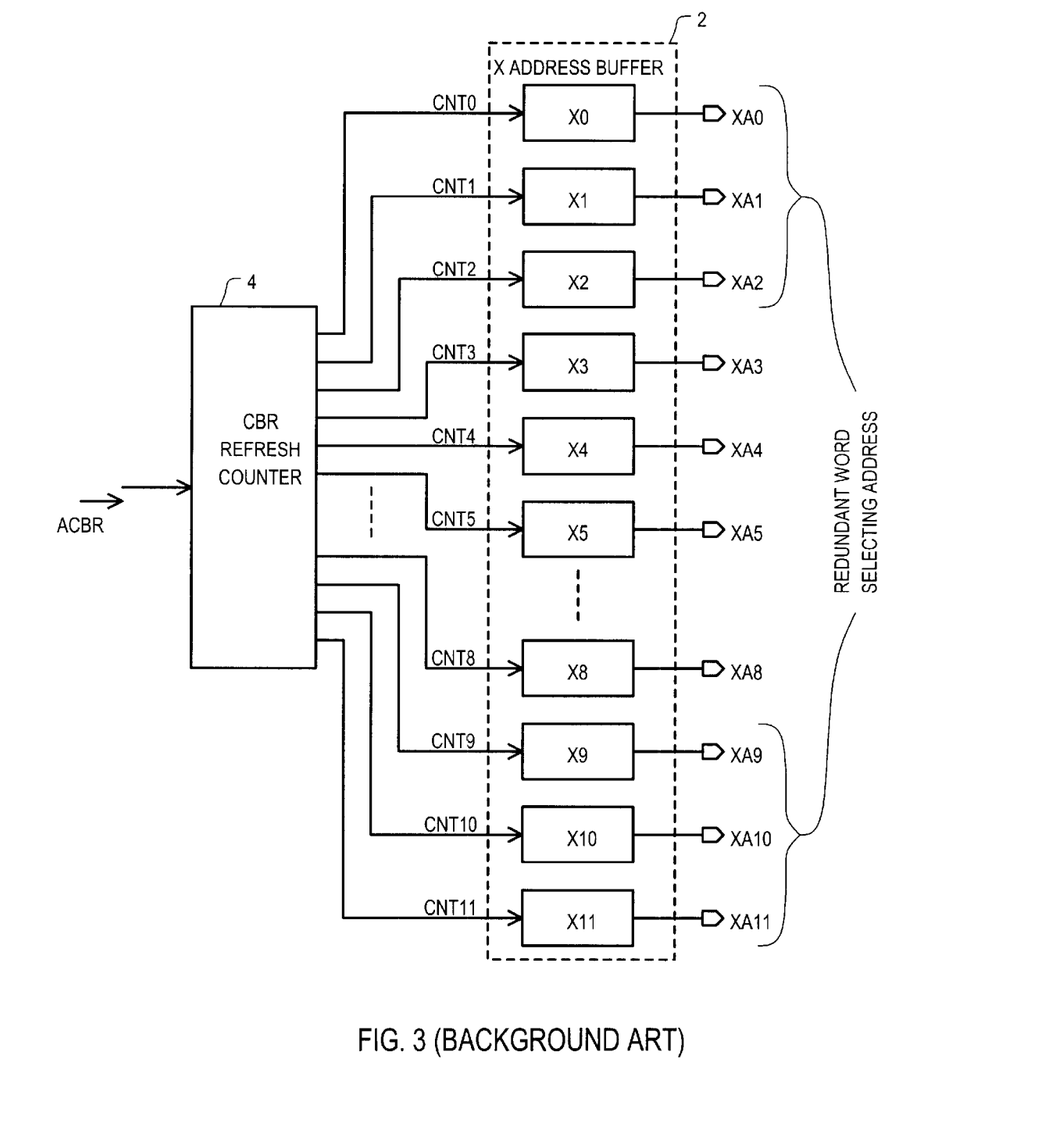
FIG. 3 is a block diagram illustrating a conventional CBR refresh counter and X address buffer.

Referring now to FIG. 3, a block diagram illustrating the CBR refresh counter 4 and X address buffer 2 is set forth.

When the CBR refresh test is performed for ordinary memory cells NC of memory cell array NM, address counter signals (CNT0 to CNT11) have a one-to-one correspondence with internal X address signals (XA0 to XA11), so that each time a CBR command is input, ordinary word lines are selected in a sequential order.

In the CBR refresh test for ordinary memory cell NC, data is written sequentially into memory cells connected with each word line. After a data holding time (pause time) has elapsed, for example 64 msec, data in the ordinary memory cells NC is read out sequentially and judged as to whether or not the correct data has been held.

Figure 4:
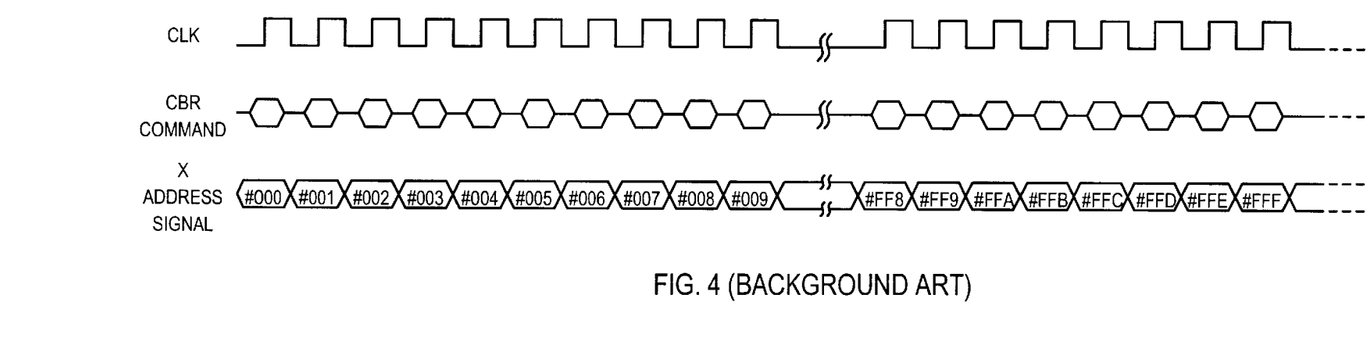
FIG. 4 is a timing diagram illustrating the output of a conventional CBR refresh counter during a CBR refresh test.

Referring now to FIG. 4, a timing diagram illustrating the output of the CBR refresh counter 4 during a CBR refresh test is set forth. CBR refresh counter 4 counts the number of times the CBR command is received in synchronism with external clock CLK. Each time a CBR command is received, the CBR refresh counter 4 outputs incremented address counter signals (CNT0 to CNT11), which is output as internal X address signals (XA0 to XA11).

An address of the selected word line is represented by hexidecimal notation in the timing diagram of FIG. 4 in which the left digit includes the high order bits. For example, word line (#FF8) corresponds to word line W4088.

X predecoder 6 and X decoder 7 sequentially select 4096 word lines using the sequentially incremented address signals (XA0 to XA11). In this way, word lines (#000) to (#FFF) are sequentially selected one per clock cycle.

In the CBR refresh test for the memory cell array, word lines are selected sequentially in accordance with the period in which the CBR command is sequentially received with an external clock edge.

However, it is difficult to execute a refresh test on redundant memory cells RC connected to a redundant word line by using an address incremented in a CBR refresh counter 4 based on a CBR command in the same manner as the refresh test on ordinary memory cells NC.

As noted earlier, when a redundant word line replaces a normal word line, the redundant word line is selected using plate address signals and word line selecting address signals. Referring once again to FIG. 3, the plate selecting address signals are internal X address signals (XA9 to XA11), which are used to select any one of plates (P0 to P7). The word line selecting address signals are internal address signals (XA0 to XA8). However, there are only 8 redundant word lines in each plate, thus the redundant word lines only occupy 3 address spaces. Thus, only 3 internal X address signals (XA0 to XA2) are used to select a redundant word line in the refresh test.

For an address signal for selecting the redundant word line, internal X address signals (XA0 to XA2 and XA9 to XA11), respectively corresponding to address counter signals (CNT0 to CNT2 and CNT9 to CNT11), are input into X redundancy control circuit 9.

Accordingly, an address of the redundant word line is determined without the use of internal X address signals (XA3 to XA8). Thus, these addresses are not used when executing a refresh test on the redundant word lines. As noted, the hexidecimal address of redundant word lines in plate P0 is RW0 (#000) to RW7 (#007). In plate P1, the hexidecimal address of redundant word lines jump to RW8 (#200) to RW15 (#207). Thus, it can be seen that the addresses are not sequential when progressing from redundant word lines in one plate to redundant word lines in an adjacent plate.

Figure 5:
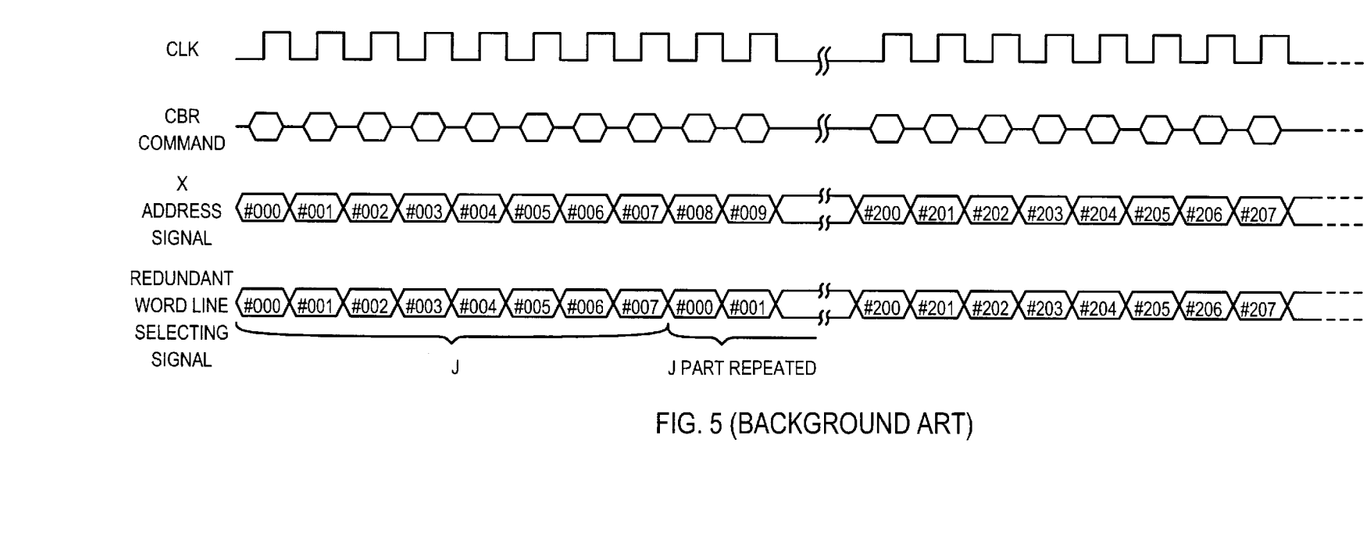
FIG. 5 is a timing diagram illustrating the selection of the redundant word lines in a conventional DRAM.

Referring now to FIG. 5, a timing diagram illustrating the selection of the redundant word lines in conventional DRAM 100 when executing a refresh test of the redundant memory cells.

In the refresh test, internal X address signals (XA0 to XA11) are sequentially incremented. However, as noted only X address signals (XA0 to XA2 and XA9 to XA11) are used to select a redundant word line. Initially redundant word lines (RW0 to RW7) are sequentially selected. However, because CBR refresh counter 4 sequentially increments the address counter output signals (CNT0 to CNT11), redundant word lines (RW0 to RW7) are repeatedly sequentially selected until X address signal XA9 is incremented and plate P1 is selected. In this case, redundant word lines (RW0 to RW7) are repeatedly sequentially selected $2^6$=64 times. Once plate P1 is selected the repetitive selection cycle is repeated for redundant word lines (RW8 to RW15). This will be continued until X address signal XA9 is changed back to zero and X address signal XA10 becomes a one, i.e., 64 times.

When the CBR refresh counter output is used for selection of a redundant word line as described above, redundant word lines (RW0 to RW55) are repeatedly refreshed 64 times each before redundant word lines (RW56 to RW63) are selected by the uppermost order addresses.

In a CBR refresh test using the conventional circuit as illustrated in conventional DRAM 100, lower order redundant word lines are selected 64 times before the upper order redundant word lines are selected. This can impact the test time and reduce test efficiency.

Also, because each redundant word line is refreshed many times, the refresh test may not have the same refresh period tested as in the case of the ordinary word line. This can affect the reliability of the refresh test results. Many manufacturers may not perform a CBR refresh test on redundant memory cells. Reasons may include complexity and inaccuracy of test results.

However, when a manufacturer selects not to perform a CBR refresh test on redundant memory cells, data holding time in the redundant memory cells are not confirmed until the redundant word line is used to replace an already known defective cell or cells. Once the fuse in a redundant word line decoder is programmed, the replacement is typically permanent. Thus, if a redundant word line that includes redundant memory cells that do not meet the required data holding time is used to replace a defective ordinary word line, then the semiconductor memory device may be rejected. In this case, the semiconductor memory device may have been a saleable product had a redundant word line that had redundant memory cells with sufficient data holding time been used instead. Thus, by performing a CBR refresh test on redundant memory cells, production yield may be decreased.

In order to address these problems, Japanese Patent Application No. Hei 10-62180 (JPA 10-62180) discloses a method for shortening the refresh cycle for a redundant word line in a semiconductor memory device. Thus, a redundant word line that does not meet the required data holding time may still properly function in a good product. This method shortens the cycle time of the refresh of the redundant word line instead of performing a test of the hold time functionality of the redundant memory cells.

This approach is problematic because a product that may include redundant memory cells having a reduced data holding time can be introduced into commerce. This product may have reduced reliability over time when it is continuously used.

Also, because the refresh periods of the ordinary memory cells differ from the redundant memory cells, a circuit is required for adjusting the timing of refreshing. This can cause the refresh control circuit to become complicated.

In light of the above discussion, it would be desirable to provide a semiconductor memory device where a refresh test, such as a CBR refresh test, on redundant memory cells is achieved in a similar fashion as the ordinary memory cells. It would also be desirable to provide the semiconductor memory device with excellent production efficiency and high reliability where the refresh test on redundant memory cells is achieved in a similar fashion as the ordinary memory cells. It would also be desirable to provide a method for the refresh test of the semiconductor memory device.

SUMMARY OF THE INVENTION

A semiconductor memory device and method for its test according to the present embodiments may include a CBR (CAS before RAS) refresh test achieved by inputting a CBR command for every redundant word line to be selected. In this way, redundant word lines may be sequentially selected without repetition until all the redundant word lines have been selected. By doing so, an accurate determination of the refresh period may be obtained. A CBR refresh counter may be activated every time a control signal is received when a refresh test on redundant memory cells is performed. Redundant counter signals may be applied to a X address buffer. The X address buffer may select the redundant counter signals to sequentially select the redundant word lines when the redundant refresh test is performed.

According to one aspect of the embodiments, a semiconductor memory device may include a memory cell array including a plurality of normal word lines and a plurality of redundant word lines. Each of the plurality of redundant word lines may be programmable to replace a defective one of the plurality of normal word lines. A test circuit may generate redundant word line selection signals so that the plurality of redundant word lines may be sequentially selected without a repeat selection of the same one of the plurality of redundant word lines until all of the plurality of redundant word lines have been selected.

According to another aspect of the embodiments, the test circuit may include a counter for generating an address by executing a counting operation every time a count command is received when normal word lines are selected. The test circuit may also include a redundancy counter for generating a redundant address by executing counting every time a cont command is received when redundant word lines are selected.

According to another aspect of the embodiments, the count command may be a CBR command and the semiconductor memory device may be a dynamic random access memory.

According to another aspect of the embodiments, the test circuit may include a counter incrementing an address when a count command is received. The test circuit may also include an address buffer that may rearrange the order of the address depending on whether a redundant word line or a normal word line is selected.

According to another aspect of the embodiments, the address buffer may include a selector for switching the order of the address when a redundant test signal is activated.

According to another aspect of the embodiments, the semiconductor memory device may be a dynamic random access memory. The test circuit may receive a redundant test signal. The redundant test signal may be activated when a redundant refresh test command is received.

According to another aspect of the embodiments, method for performing a refresh test in a semiconductor memory device having a plurality of normal word lines and a plurality of redundant word lines may include the steps of generating an address wherein a test address output circuit may sequentially generate the address for each normal word line, sequentially activating the plurality of normal word lines based on the address generated to refresh memory cells electrically connected to the activated normal word line, generating a redundant address wherein the test address output circuit may sequentially generate the redundant address for each redundant word line, and sequentially activating the plurality of redundant word lines based on the redundant address generated to refresh redundant memory cells electrically connected to the activated redundant word line without a repeat activation of any of the plurality of redundant word lines until all of the plurality of redundant word lines have been activated.

According to another aspect of the embodiments, generating the address may include counting every time a count command is received to sequentially generate the address for each normal word line. Generating the redundant address may include counting every time a count command is received to sequentially generate the redundant address for each redundant word line.

According to another aspect of the embodiments, the count command may be a CBR command. The semiconductor memory device may be a dynamic random access memory.

According to another aspect of the embodiments, the step of generating the redundant address may include changing the way counter outputs are mapped as compared to the step of generating the address.

According to another aspect of the embodiments, changing the way the counter outputs are mapped may include switching the order of counter outputs with a selector when one of the plurality of redundant word lines is activated.

According to another aspect of the embodiments, changing the way counter outputs are mapped may include generating a redundancy test signal.

According to another aspect of the embodiments, the refresh test may be performed before programming redundancy.

According to another aspect of the embodiments, a semiconductor memory device may include a memory cell array including a plurality of memory cell plates. Each memory cell plate may include a plurality of normal word lines and a plurality of redundant word lines. Each of the plurality of redundant word lines may be programmable to replace a defective one of the plurality of normal word lines. A test circuit may generate redundant word line selection signals so that the plurality of redundant word lines may be sequentially selected in each plate without a repeat selection of the same one of the plurality of redundant word lines until all of the plurality of redundant word lines in the plurality of plates have been selected.

According to another aspect of the embodiments, the plurality of plates may include a first plate and a second plate. The test circuit may be responsive to an externally applied selection command to generate the redundant word line selection signals. When a last one of the plurality of the redundant word lines in the first plate have been selected, one of the plurality of redundant word lines in the second plate may be selected on the subsequent selection command.

According to another aspect of the embodiments, the selection command may be a CBR command received synchronously with an external clock signal. The semiconductor memory device may be a dynamic random access memory.

According to another aspect of the embodiments, the test circuit may include a counter for generating an address by executing a counting operation every time a selection command is received when normal word lines are selected. The test circuit may also include a redundancy counter for generating a redundant address by executing counting every time the selection command is received when redundant word lines are selected.

According to another aspect of the embodiments, the test circuit may include a counter incrementing an address when a selection command is received and an address buffer rearranging the order of the address depending on whether a redundant word line or a normal word line is selected.

According to another aspect of the embodiments, the address buffer may include a selector for switching the order of the address when a redundant test signal is activated.

According to another aspect of the embodiments, the test circuit may receive a redundant test signal that may be activated when a redundant refresh test command is received.

DETAILED DESCRIPTION OF THE EMBODIMENTS

Various embodiments of the present invention will now be described in detail with reference to a number of drawings.

First Embodiment

Figure 6:
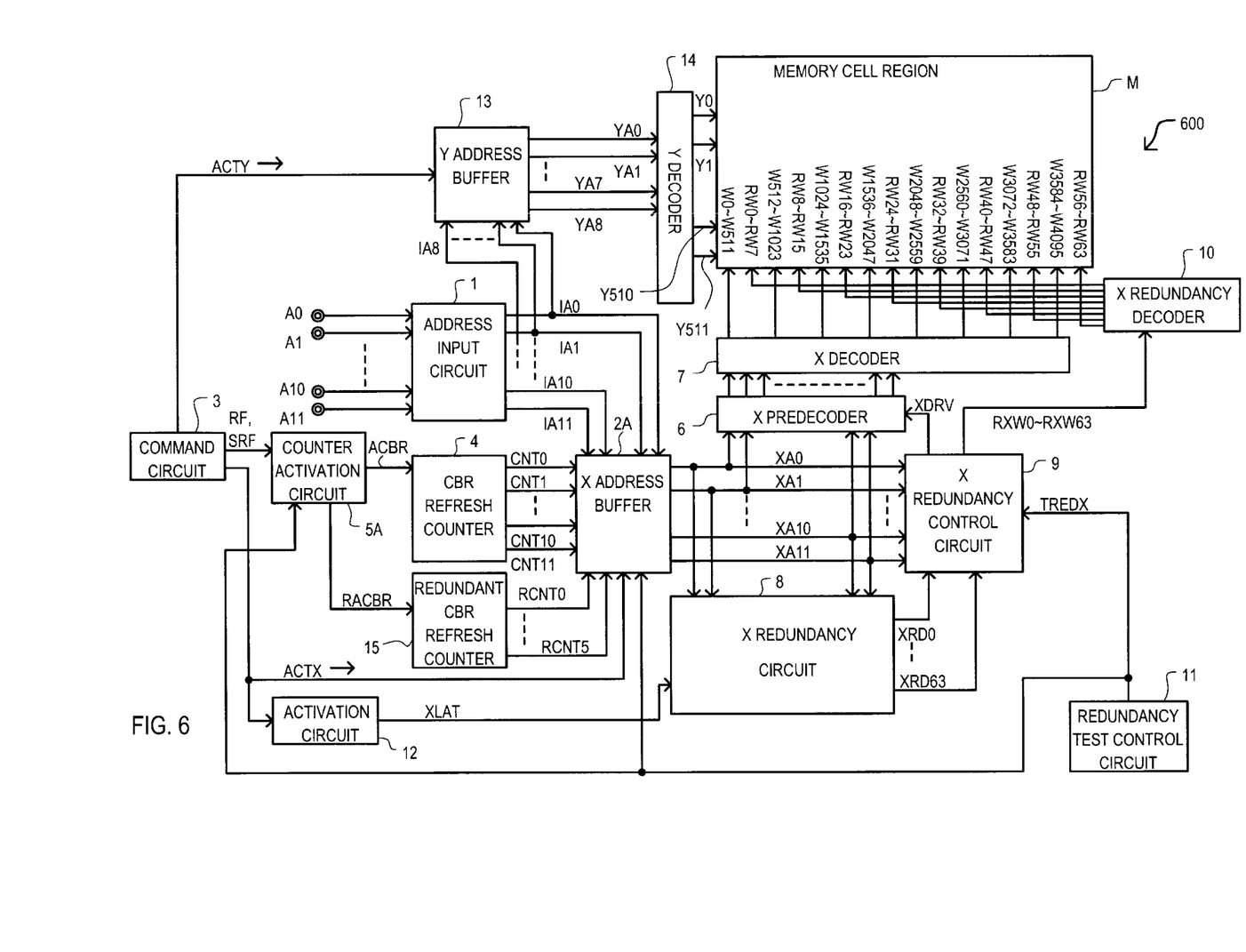
FIG. 6 is a block schematic diagram of a semiconductor memory device according to a first embodiment.

Referring now to FIG. 6, a block schematic diagram of a semiconductor memory device according to a first embodiment is set forth and given the general reference character 600.

Semiconductor memory device 600 may include similar constituents as conventional semiconductor memory device 100 and such constituents may be given the same general reference character.

Semiconductor memory device 600 may include different elements and operations than conventional semiconductor memory device 100. For example, in a refresh test on a redundant memory cell, a redundant CBR refresh counter 15 may be provided to generate addresses for selecting redundant word lines (RW0 to RW63) without the use of a CBR refresh counter 4.

Also, X address buffer 2 of conventional semiconductor memory device 100 may be replaced by X address buffer 2A in semiconductor memory device 600. X address buffer 2A may be used to generate internal X address signals (XA0 to XA11) by multiplexing between address signals output by CBR refresh counter 4 and redundant counter signals output from redundant CBR refresh counter 15 in the CBR refresh test.

X address buffer 2A may output internal X address signals (XA0 to XA11) by selecting either an output of redundant CBR refresh counter 15 or an output of CBR refresh counter 4 based on the logic level of control signal TREDX.

Counter activation circuit 5A may output CBR refresh counter activation signal ACBR to CBR refresh counter 4 when normal memory cell NC is subjected to a refresh test. Based upon refresh command signal RF from command circuit 3, counter activation circuit 5A may output redundant CBR command signal RACBR to redundant CBR refresh counter 15 when redundant memory cell RC is subjected to a refresh test.

Redundant CBR refresh counter 15 may be activated every time redundant CBR command signal RACBR is received. In this case, redundant CBR refresh counter 15 may count the time a CBR command is received and output a count value to X address buffer 2A as redundant counter signals (RCNT0 to RCNT5).

Redundant counter signals (RCNT0 to RCNT2) may address one of eight redundant word lines for each plate (P0 to P7). Redundant counter signals (RCNT3 to RCNT5) may address one of eight plates (P0 to P7) and may be considered plate selecting addresses.

Redundant CBR refresh counter 15 may output sequential values of redundant counter signals (RCNT0 to RCNT5) to X address buffer 2A. In this way, all redundant memory cells RC may be refreshed by applying a CBR command 64 times.

Semiconductor memory device 600 may include a test address output circuit including the CBR refresh counter 4, redundant CBR refresh counter 15, and X address buffer 2A for generating internal X addresses (XA0 to XA11) that may sequentially select the redundant word lines when the CBR refresh test is applied.

The operation of the first embodiment will now be described from the viewpoint of a CBR refresh test on redundant memory cells RC.

First data may be sequentially written into each redundant memory cell RC connected with redundant word lines (RW0 to RW63).

Then CBR refresh commands for the redundant memory cells RC may be executed after a predetermined period, i.e., holding time for data to be tested. Thereafter, data of redundant memory cells RC connected with redundant word lines (RW0 to RW63) may be sequentially read out and judged whether or not the predetermined data has been held in the redundant memory cells RC.

Figure 8:
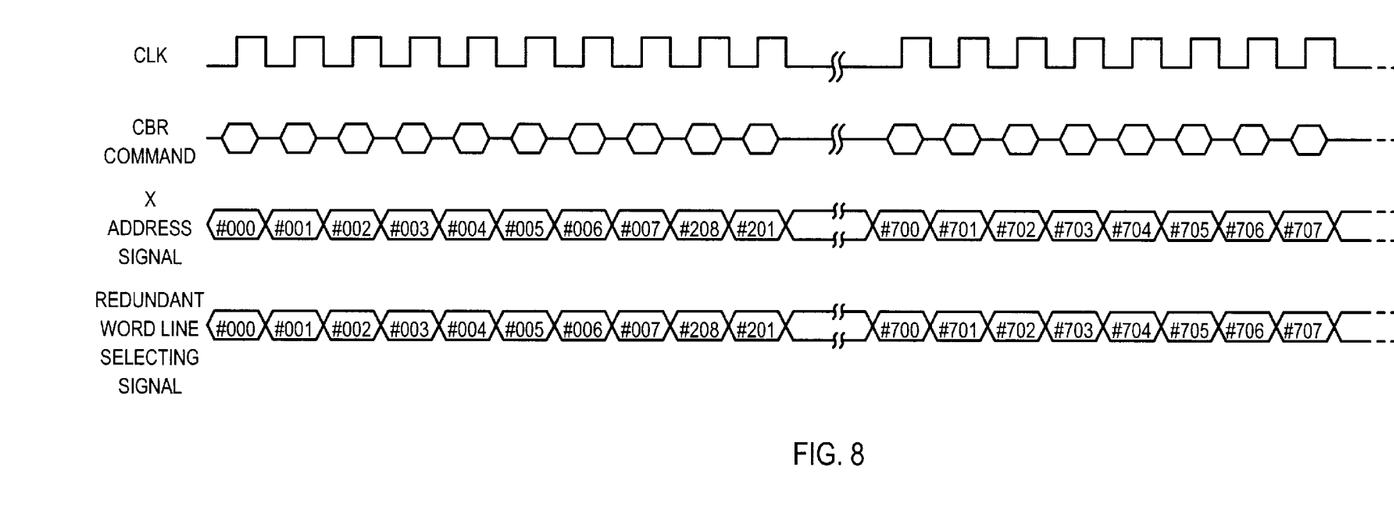
FIG. 8 is a timing diagram illustrating CBR refreshing of the redundant memory cells according to embodiments.

Referring now to FIG. 8, a timing diagram illustrating CBR refreshing of the redundant memory cells is set forth.

The timing diagram of FIG. 8 can include an external clock CLK, a CBR refresh command, X address signals in hexidecimal notation and a redundant word line selecting signal in hexidecimal notation.

Redundant CBR refresh counter 15 may be activated every time redundant CBR command signal RACBR is generated when a CBR command is received in synchronism with the external clock CLK. Redundant CBR refresh counter 15 may count the number of times the CBR command has been received and output redundant counter signals (RCNT0 to RCNT5) to be used as internal X address signals (XA0 to XA2) and internal X address signals (XA9 to XA11), respectively by X address buffer 2A.

Each address of the resultant redundant word line may be illustrated in FIG. 8 in hexidecimal notation in a similar fashion to the illustration in FIG. 5.

Figure 7:
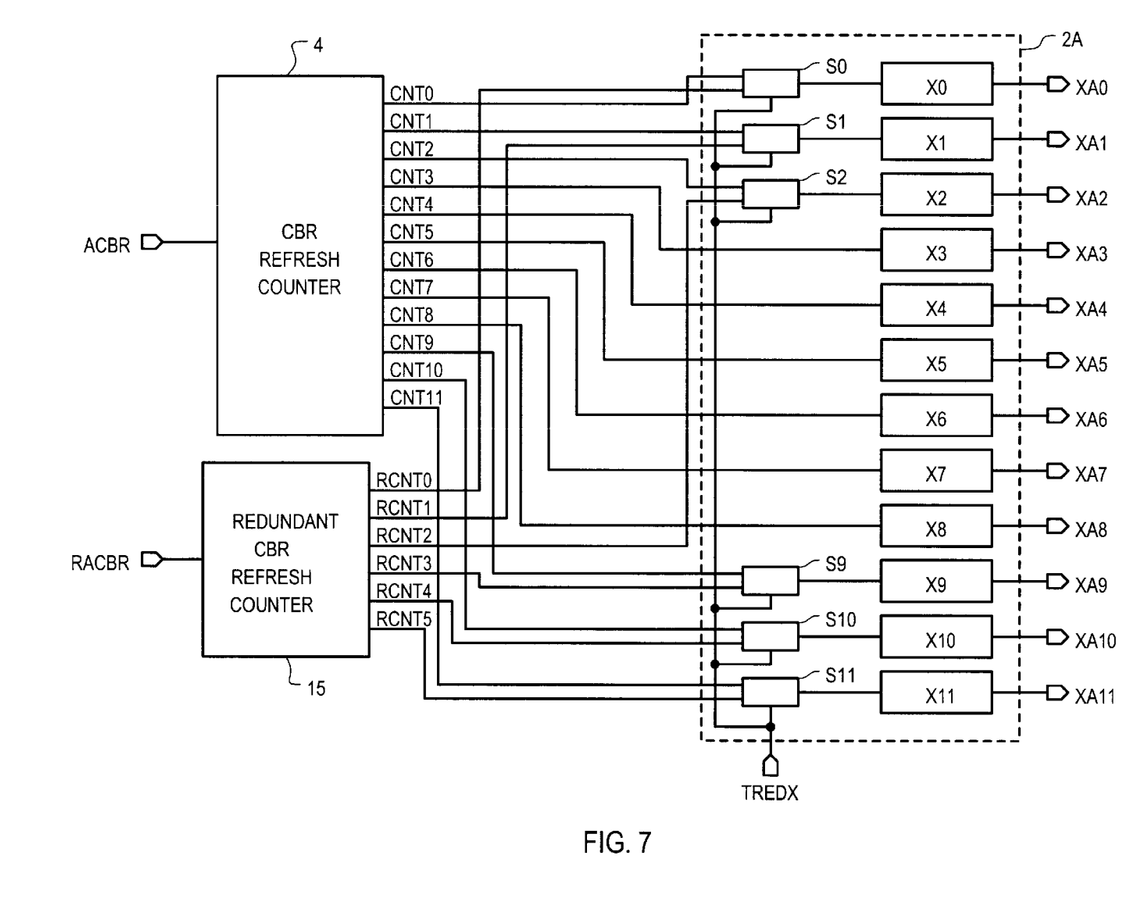
FIG. 7 is a block schematic diagram illustrating a CBR refresh counter, a redundant CBR refresh counter, and a X address buffer according to the first embodiment.

Referring now to FIG. 7, a block schematic diagram illustrating CBR refresh counter 4, redundant CBR refresh counter 15, and X address buffer 2A is set forth.

X address buffer 2A may include selectors (S0 to S2 and S9 to S11). Selectors (S0 to S2 and S9 to S11) may select either a counter address signal (CNT) or redundant counter signal (RCNT) to be output as a respective X address signal (XA) based on the logic level of test mode activation signal TREDX.

When redundant cell test mode activation signal TREDX is active, X address buffer 2A may output redundant counter signals (RCNT0 to RCNT5) from redundant CBR refresh counter 15 as internal X address signals (XA0 to XA2 and XA9 to XA11), respectively, through selectors (S0 to S2 and S9 to S11).

In contrast, when redundant cell test mode activation signal TREDX is not active, X address buffer 2A may output address counter signals (CNT0 to CNT11) from CBR refresh counter 4 as internal X address signals (XA0 to XA11), respectively, to achieve CBR refreshing for ordinary memory cells NC.

In the redundant CBR refresh test, internal X address signals (XA3 to XA8) may be neglected such that only internal X address signals (XA0 to XA2 and XA9 to XA11) may sequentially change every time the CBR command is received. In this way, the change in the addresses indicated by internal X address signals (XA0 to XA11) and the change in the addresses indicated by redundant word line (RW0 to RW64) may be coincident with each other as illustrated in FIG. 8.

For example, when redundant counter signal RCNT3 changes, internal X address signal XA3 may not change, but internal X address signal XA9 (a plate select address) may change. For example, if the internal X address signals (XA0 to XA11) change from (#007) to (#200) as illustrated in FIG. 8, a redundant word line RW8 in the next plate P1 may be selected instead of reselecting a word line in the same plate as in the conventional approach. This may be accomplished by only incrementing the plate selection addresses (XA9 to XA11) and redundant word line selection addresses (XA0 to XA2) while leaving the other addresses (XA3 to XA8) unchanged.

X address buffer 2A may output internal X address signals (XA0 to XA11) incremented in a manner such that the same redundant word line among redundant word lines (RW0 to RW63) may not be reselected until all the redundant word lines (RW0 to RW64) have been selected. Thus, the redundant CBR refresh test may be efficiently performed on all redundant memory cells RC with an accurate hold time determined.

In accordance with the semiconductor memory device 600 of the first embodiment, redundant CBR refresh counter 15 and X address buffer 2A may be employed so that counter 15 may only generate a redundant word line for each plate one time in a continuous manner. In this way, when sequential redundant word lines have discontinuous addresses, for example when jumping from one plate to a consecutive plate, the addresses for the redundant word line may change in a continuous manner such that the discontinuous addresses may be skipped without being generated. Thus, there may be no recycling of redundant word lines until all the redundant word lines have been selected and respective redundant memory cells have been refreshed.

The semiconductor memory device 600 according to the first embodiment may eliminate the drawback of the conventional semiconductor memory device 100 in which redundant word lines may be selected multiple times in the execution of the CBR refresh test of the redundancy before all of the redundant word lines have been selected. By doing so, the CBR refresh test on the redundant memory cells RC may be executed in the same fashion as the CBR refresh test of the ordinary memory cells NC and the refresh period may be more accurately determined. Furthermore, by reducing the number of refresh test commands to refresh all the redundant memory cells NC, the test time may be greatly reduced as compared to the conventional approach.

The semiconductor memory device 600 according to the first embodiment may thus reduce the test time. It may be possible to execute the CBR refresh test on the redundant memory cells RC before fuse trimming or blowing. Thus, by inspecting the data hold time of redundant memory cells RC before programming the redundancy, the number of defective devices may be reduced and manufacturing costs may decrease.

Also, the semiconductor memory device 600 according to the first embodiment may be assembled and shipped after using the CBR refresh test to verify the data hold time of the redundant memory cell RC. This may eliminate the need of reducing the refresh cycle for redundant word lines in order to compensate for potentially reduced holding times of redundant cells as disclosed in Japanese Patent Application Hei 10-62180. Thus, the complexity of the refresh control circuit may be reduced and such potentially defective products may not be introduced into commerce.

Second Embodiment

A second embodiment will now be discussed. The second embodiment may not include a new counter used for CBR refreshing of a redundant memory cell as may be included in the first embodiment. Instead, the second embodiment may include a modified X address buffer which may modify the correspondence between an address counter signal and an internal X address signal. Referring to FIG. 1, the second embodiment may include an X address buffer 2B as indicated in parenthesis.

Figure 9:
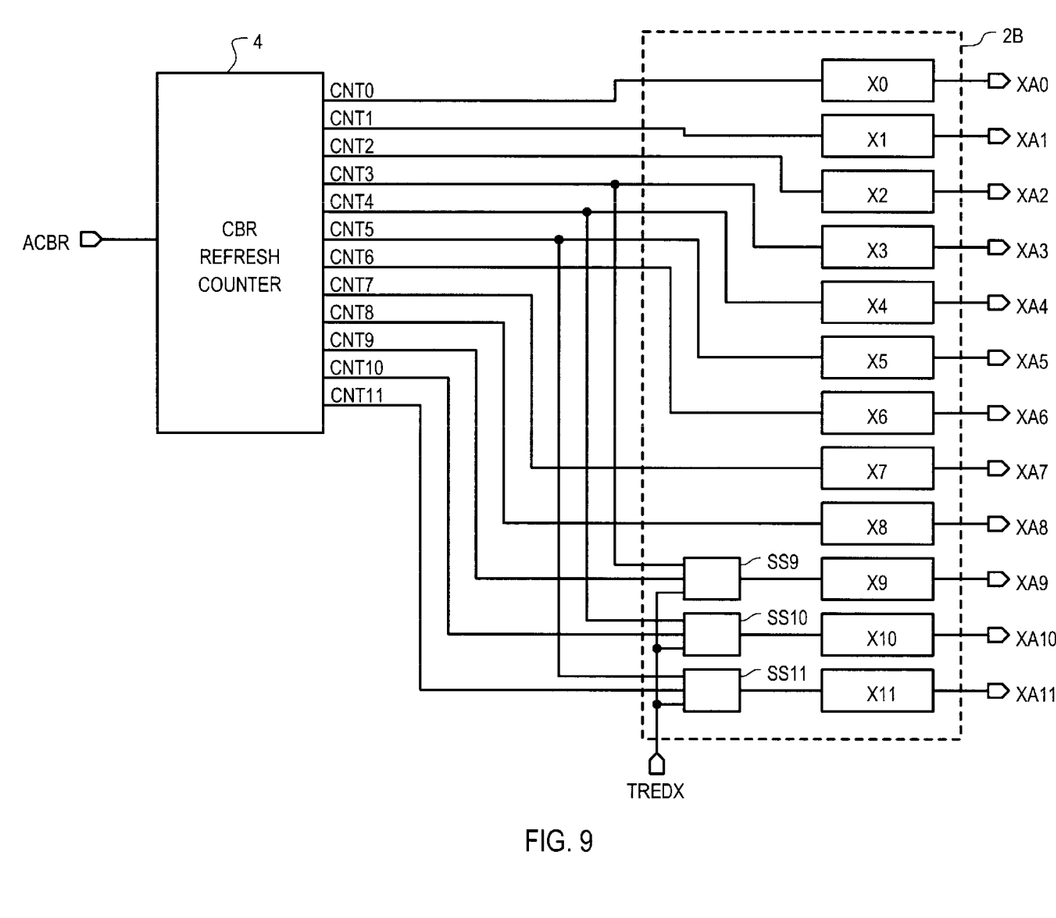
FIG. 9 is a block schematic diagram of a CBR refresh counter and X address buffer according to a second embodiment.

Referring now to FIG. 9, a block schematic diagram of the CBR refresh counter 4 and X address buffer 2B in accordance with the second embodiment is set forth.

X address buffer 2B may receive address counter signals (CNT0 to CNT11) and redundant cell test mode activation signal TREDX as inputs and may provide internal X address signals (XA0 to XA11) as outputs. X address buffer 2B may include selectors (SS9, SS10, and SS11) and buffers (X0 to X11). Selector SS9 may receive address counter signals (CNT3 and CNT9) and redundant cell test mode activation signal TREDX as inputs and may provide an output to buffer X9. Selector SS10 may receive address counter signals (CNT4 and CNT10) and redundant cell test mode activation signal TREDX as inputs and may provide an output to buffer X10. Selector SS11 may receive address counter signals (CNT5 and CNT11) and redundant cell test mode activation signal TREDX as inputs and may provide an output to buffer X11. In this way selectors (SS9, SS10, and SS11) may select whether address counter signals (CNT3 to CNT5) or address counter signals (CNT9 to CNT11) are respectively output as internal X address signals (XA9 to XA11) based on the logic value of redundant cell test mode activation signal TREDX.

The semiconductor memory device according to the second embodiment of the present invention may include a test address output circuit which may include the CBR refresh counter 4 and X address buffer 2B for generating internal X addresses (XA0 to XA11). In this way, redundant word lines may be sequentially selected when a CBR refresh test on the redundant memory cells RC is performed.

The operation of the second embodiment will now be described from the viewpoint of the CBR refresh test on the redundant memory cells RC.

Referring once again to FIG. 8, a timing diagram of the redundant CBR refreshing may be illustrated. CBR refresh counter 4 may be activated every time CBR refresh counter activation signal ACBR is enabled. In this way, every time a CBR command is received synchronously with external clock CLK, CBR refresh counter 4 may increment the address counter signals (CNT0 to CNT11) that may be output to X address buffer 2B.

When the semiconductor memory device is in the CBR refresh test on redundant memory cells RC, X address buffer 2B may output address counter signals (CNT0 to CNT2) as internal X address signals (XA0 to XA2), respectively. However, because redundant cell test mode activation signal TREDX may be active, X address buffer 2B may output address counter signals (CNT3 to CNT5) as internal X address signals (XA9 to XA11), respectively. This may be accomplished by providing selectors (SS9 to SS11) that may respectively switch the signal paths of address counter signals (CNT3 to CNT5) to generate X address signals (XA9 to XA11).

In contrast, when normal cells NC undergo a refresh test, test mode activation signal TRDX may be disabled. In this case, selectors (SS9 to SS11) may apply address counter signals (CNT9 to CNT11) to respectively generate X address signals (XA9 to XA11).

In the redundant CBR refresh test, as described above, address buffer 2B may modify the mapping of the address counter signals and internal X address signals, so that internal address signals (XA0, XA1, XA2, XA9, XA10, and XA11) may be incremented sequentially every time a CBR command is synchronously received. In this way, as illustrated in FIG. 8, a change in addresses indicated by internal address signals (XA0, XA1, XA2, XA9, XA10, and XA11) may be coincident with a change of the selection of redundant word lines (RW0 to RW63).

In the conventional approach, the CBR command is applied 4096 times. However, in the second embodiment the refresh test may be performed on all redundant memory cells RC by applying the CBR command 64 times, which may be equivalent to the number or redundant word lines.

In a similar manner as in the first embodiment, when address counter signal CNT3 changes, internal X address signal XA3 may not change, but internal X address signal XA9 may change instead so that a different plate (P0 to P7) may be selected. For example, if the internal X address signals (XA0 to XA11) change from (#007) to (#200) as illustrated in FIG. 8, a redundant word line RW8 in the next plate P1 may be selected instead of reselecting a word line in the same plate as in the conventional approach. This may be accomplished by only incrementing the plate selection addresses (XA9 to XA11) and redundant word line selection addresses (XA0 to XA2) while leaving the other addresses (XA3 to XA8) unchanged.

X address buffer 2B may output internal X address signals (XA0 to XA11) incremented in a manner such that the same redundant word line among redundant word lines (RW0 to RW63) may not be reselected until all the redundant word lines (RW0 to RW63) have been selected. Thus, the redundant CBR refresh test may be efficiently performed on all redundant memory cells RC with an accurate hold time determined.

In accordance with the semiconductor memory device of the second embodiment, CBR refresh counter 4 and X address buffer 2B may be employed to generate a redundant word line for each plate only one time in a continuous manner. In this way, when sequential redundant word lines have discontinuous addresses, for example when jumping from one plate to a consecutive plate, the addresses for the redundant word line may change in a continuous manner such that the discontinuous addresses may be skipped without being generated. Thus, there may be no recycling of redundant word lines until all the redundant word lines have been selected and respective redundant memory cells have been refreshed.

In this way, the semiconductor memory device according to the present embodiment may exhibit a similar effect as that of the first embodiment.

Third Embodiment

A third embodiment will now be discussed. The third embodiment may differ from conventional semiconductor memory device 100 illustrated in FIG. 1 in that an X address buffer 2C may be used instead of X address buffer 2. By using X address buffer 2C, a correspondence between the address counter signals and the internal X address signals may be changed. Referring to FIG. 1, the third embodiment may include an X address buffer 2C as indicated in parenthesis.

Figure 10:
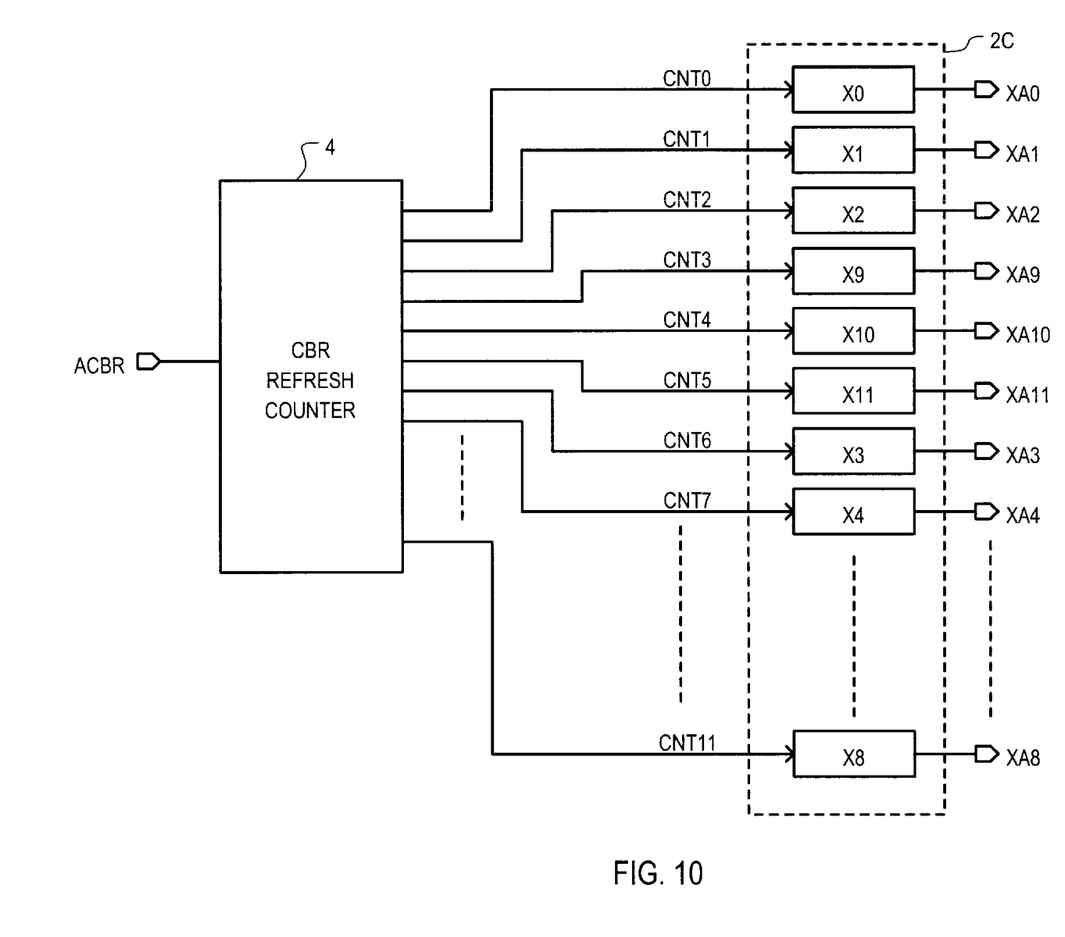
FIG. 10 is a block schematic diagram of a CBR refresh counter and X address buffer according to a third embodiment.

Referring now to FIG. 10, a block schematic diagram of the CBR refresh counter 4 and X address buffer 2C in accordance with the third embodiment is set forth.

X address buffer 2C may receive address counter signals (CNT0 to CNT11) as inputs and may provide internal X address signals (XA0 to XA11) as outputs. In X address buffer 2C the correspondence between the address counter signals (CNT0 to CNT11) and the internal X address signals (XA0 to XA11) may be changed as compared to conventional X address buffer 2.

In X address buffer 2C, address counter signals (CNT0, CNT1, CNT2, CNT3, CNT4, and CNT5) may be input into respective buffers (X0, X1, X2, X9, X10, and X11) and address counter signals (CNT6, CNT7, CNT8, CNT9, CNT10, and CNT11) may be input into respective buffers (X3, X4, X5, X6, X7, and X8).

In this way, address counter signals (CNT0, CNT1, CNT2, CNT3, CNT4, and CNT5) may be used to generate internal X address signals (XA0, XA1, XA2, XA9, XA10, and XA11), respectively, and address counter signals (CNT6, CNT7, CNT8, CNT9, CNT10, and CNT11) may be used to generate internal X address signals (XA3, XA4, XA5, XA6, XA7, and XA8), respectively. By changing the connections of the respective signal lines, internal X address signals (XA0, XA2, XA9, XA10, and XA11) may be sequentially incremented when the CBR refresh counter 4 counts.

Thus, in the semiconductor memory device according to the third embodiment, a test address output circuit may include CBR refresh counter 4 and X address buffer 2C for generating internal X address signals (XA0, XA1, XA2, XA9, XA10, and XA11) for sequentially selecting redundant word lines (RW0 to RW63) when a CBR refresh test on redundant memory cells RC is performed.

Referring once again to FIG. 8, a timing diagram of the redundant CBR refreshing may be illustrated. CBR refresh counter 4 may be activated every time CBR refresh counter activation signal ACBR is enabled. In this way, every time a CBR command is received synchronously with external clock CLK, CBR refresh counter 4 may increment the address counter signals (CNT0 to CNT11) that may be output to X address buffer 2C.

X address buffer 2C may output address counter signals (CNT0, CNT1, CNT2, CNT3, CNT4, and CNT5) as internal X address signals (XA0, XA1, XA2, XA9, XA10, and XA11), respectively.

In the redundant CBR refresh test, as described above, address buffer 2C may replace the relationship between the address counter signals and internal X address signals so that internal X address signals (XA0, XA1, XA2, XA9, XA10, and XA11) may be sequentially changed every time a CBR command is received. In this way, as illustrated in FIG. 8, a change in internal X address signals (XA0, XA1, XA2, XA9, XA10, and XA11) may trigger a change in the selected redundant word line (RW0 to RW63).

In the conventional approach, the CBR command is applied 4096 times. However, in the third embodiment the refresh test may be performed on all redundant memory cells RC by applying the CBR command 64 times, which may be equivalent to the number or redundant word lines.

In a similar manner as in the first embodiment, when address counter signal CNT3 changes, internal X address signal XA3 may not change, but internal X address signal XA9 may change instead so that a different plate (P0 to P7) may be selected. For example, if the internal X address signals (XA0 to XA11) change from (#007) to (#200) as illustrated in FIG. 8, a redundant word line RW8 in the next plate P1 may be selected instead of reselecting a word line in the same plate as in the conventional approach. This may be accomplished by only incrementing the plate selection addresses (XA9 to XA11) and redundant word line selection addresses (XA0 to XA2) while leaving the other addresses (XA3 to XA8) unchanged.

X address buffer 2C may output internal X address signals (XA0 to XA11) incremented in a manner such that the same redundant word line among redundant word lines (RW0 to RW63) may not be reselected until all the redundant word lines (RW0 to RW63) have been selected. Thus, the redundant CBR refresh test may be efficiently performed on all redundant memory cells RC with an accurate hold time determined.

In accordance with the semiconductor memory device of the third embodiment, CBR refresh counter 4 and X address buffer 2C may be employed to generate a redundant word line for each plate only one time in a continuous manner. In this way, when sequential redundant word lines have discontinuous addresses, for example when jumping from one plate to a consecutive plate, the addresses for the redundant word line may change in a continuous manner such that the discontinuous addresses may be skipped without being generated. Thus, there may be no recycling of redundant word lines until all the redundant word lines have been selected and respective redundant memory cells have been refreshed.

In this way, the semiconductor memory device according to the present embodiment may exhibit a similar effect as that of the first embodiment.

It is understood that the embodiments described above are exemplary and the present invention should not be limited to those embodiments. Specific structures should not be limited to the described embodiments.

Redundant bit lines may be included in the memory cell region M.

The first to third embodiments may also be applicable to a DRAM that is divided into a plurality of banks, i.e., a plurality of banks such as memory cell region M, as just one example.

In a construction that may correspond to the first embodiment, redundant CBR refresh counter 15 and X address buffer 2A may be commonly used for each bank of a semiconductor memory device including a plurality of banks. Each bank may be selected on the basis of a predetermined address signal whereby a CBR refresh test on the redundant memory cells RC may be achieved for each bank, as just one example.

In a construction that may correspond to the second and third embodiments, X address buffers (2B and 2C) may be commonly used for each bank of a semiconductor device including a plurality of banks. Each bank may be selected on the basis of a predetermined address signal whereby a CBR refresh test on the redundant memory cells RC may be achieved for each bank, as just one example.

In a semiconductor memory device that has a memory cell region M which may include a plurality of banks, the address input circuit 1, command circuit 3, CBR refresh counter 4, counter activation circuit (5A or 5) redundant test control circuit 11, and Y address buffer 13 may be commonly used by each bank. However, each bank in memory cell region M may include a X predecoder 6, X decoder 7, X redundancy circuit 8, X redundancy control circuit 9, X redundant decoder 10, activation circuit 12, and Y decoder 14, as just a few examples.

In accordance with the semiconductor device of the present invention, redundant word lines may not be repeatedly selected during the CBR refresh test until all of the redundant word lines have been selected. Therefore, a CBR refresh test on redundant memory cells may be similar to the normal memory cells. Also, by doing so, fewer refresh cycles may be needed to complete the refreshing of redundant memory cells and test time may be reduced.

In accordance with the semiconductor memory device of the present invention, A CBR refresh test may be executed on redundant memory cells in which the refresh period may be similar to the refresh period of normal memory cells. The number of CBR commands necessary to complete the refresh of redundant memory cells connected to redundant word lines may be the same as the number of redundant word lines. In this way, fewer refresh cycles may be needed to complete the refreshing of redundant memory cells and test time may be reduced and the refresh time of redundant memory cells may be more accurately determined.

Furthermore, the semiconductor memory device according to the present invention may thus reduce the test time. It may be possible to execute the CBR refresh test on the redundant memory cells before fuse trimming or blowing. By inspecting the data hold time of redundant memory cells before programming the redundancy, the number of defective devices may be reduced and manufacturing costs may decrease.

The CBR refresh test may be entered by applying any combination of an over voltage, key address, or test input signals to selected bond pads on the semiconductor device, as just a few examples.

A CBR command in a synchronous memory device may include CAS and RAS being at a predetermined logic level at the time a clock transition occurs, as just one example.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory device, comprising:
   a memory cell array including a plurality of normal word lines and a plurality of redundant word lines wherein each of the plurality of redundant word lines are programmable to replace a defective one of the plurality of normal word lines;
   a test circuit that generates redundant word line selection signals so that the plurality of redundant word lines are sequentially selected without a repeat selection of the same one of the plurality of redundant word lines until all of the plurality of redundant word lines have been selected.

2. The semiconductor memory device according to claim 1, wherein:
   the test circuit includes a counter for generating an address by executing a counting operation every time a count command is received when normal word lines are selected and a redundancy counter for generating a redundant address by executing counting every time a count command is received when redundant word lines are selected.

3. The semiconductor memory device of claim 2, wherein:
   the count command is a CAS before RAS command and the semiconductor memory device is a dynamic random access memory.

4. The semiconductor memory device of claim 1, wherein:
   the test circuit includes a counter incrementing an address when a count command is received and an address buffer rearranging the order of the address depending on whether a redundant word line or a normal word line is selected.

5. The semiconductor memory device of claim 4, wherein:
   the address buffer includes a selector for switching the order of the address when a redundant test signal is activated.

6. The semiconductor memory device of claim 1, wherein:
   the semiconductor memory device is a dynamic random access memory; and
   the test circuit is coupled to receive a redundant test signal being activated when a redundant refresh test command is received.

7. A method for performing a refresh test in a semiconductor memory device having a plurality of normal word lines and a plurality of redundant word lines, comprising the steps of:
   generating an address wherein a test address output circuit sequentially generates the address for each normal word line;
   sequentially activating the plurality of normal word lines based on the address generated to refresh memory cells electrically connected to the activated normal word line;
   generating a redundant address wherein the test address output circuit sequentially generates the redundant address for each redundant word line; and
   sequentially activating the plurality of redundant word lines based on the redundant address generated to refresh redundant memory cells electrically connected to the activated redundant word line without a repeat activation of any of the plurality of redundant word lines until all of the plurality of redundant word lines have been activated.

8. The method for performing a refresh test of claim 7, wherein:
   generating the address includes counting every time a count command is received to sequentially generate the address for each normal word line; and
   generating the redundant address includes counting every time a count command is received to sequentially generate the redundant address for each redundant word line.

9. The method for performing a refresh test of claim 8, wherein:

the count command is a CAS before RAS command; and the semiconductor memory device is a dynamic random access memory.

10. The method for performing a refresh test of claim 7, wherein:

the step of generating the redundant address includes changing the way counter outputs are mapped as compared to the step of generating the address.

11. The method for performing a refresh test of claim 10, wherein:

changing the way counter outputs are mapped includes switching the order of counter outputs with a selector when one of the plurality of redundant word lines is activated.

12. The method for performing a refresh test of claim 10, wherein:

changing the way counter outputs are mapped includes generating a redundancy test signal.

13. The method for performing a refresh test of claim 7, wherein:

the refresh test is performed before programming redundancy.

14. A semiconductor memory device, comprising:

a memory cell array including a plurality of memory cell plates;

each memory cell plate includes a plurality of normal word lines and a plurality of redundant word lines wherein each of the plurality of redundant word lines are programmable to replace a defective one of the plurality of normal word lines;

a test circuit that generates redundant word line selection signals so that the plurality of redundant word lines are sequentially selected in each plate without a repeat selection of the same one of the plurality of redundant word lines until all of the plurality of redundant word lines in the plurality of plates have been selected.

15. The semiconductor memory device of claim 14, wherein:

the plurality of plates includes a first plate and a second plate;

the test circuit is responsive to an externally applied selection command to generate the redundant word line selection signals; and when a last one of the plurality of the redundant word lines in the first plate have been selected, one of the plurality of redundant word lines in the second plate is selected on the subsequent selection command.

16. The semiconductor memory device of claim 15, wherein:

the selection command is a CAS before RAS command received synchronously with an external clock signal; and the semiconductor memory device is a dynamic random access memory.

17. The semiconductor memory device of claim 14, wherein:

the test circuit includes a counter for generating an address by executing a counting operation every time a selection command is received when normal word lines are selected and a redundancy counter for generating a redundant address by executing counting every time the selection command is received when redundant word lines are selected.

18. The semiconductor memory device of claim 14, wherein:

the test circuit includes a counter incrementing an address when a selection command is received and an address buffer rearranging the order of the address depending on whether a redundant word line or a normal word line is selected.

19. The semiconductor memory device of claim 14, wherein:

the address buffer includes a selector for switching the order of the address when a redundant test signal is activated.

20. The semiconductor memory device of claim 14, wherein:

the test circuit is coupled to receive a redundant test signal being activated when a redundant refresh test command is received.

* * * * *